US009780944B2

(12) United States Patent
Sachse et al.

(10) Patent No.: US 9,780,944 B2
(45) Date of Patent: Oct. 3, 2017

(54) FREQUENCY CONTROL DATA SYNCHRONIZATION

(71) Applicant: Atmel Corporation, San Jose, CA (US)

(72) Inventors: Eric Sachse, Dresden (DE); Dietmar Eggert, Dresden (DE); Sascha Beyer, Medingen (DE); Wolfram Kluge, Dresden (DE)

(73) Assignee: Atmel Corporation, San Jose, CA (US)

( * ) Notice: Subject to any disclaimer, the term of this patent is extended or adjusted under 35 U.S.C. 154(b) by 72 days.

(21) Appl. No.: 14/815,776

(22) Filed: Jul. 31, 2015

(65) Prior Publication Data

US 2017/0033919 A1    Feb. 2, 2017

(51) Int. Cl.
| | |
|---|---|
| G01S 13/84 | (2006.01) |
| H04L 7/033 | (2006.01) |
| H03J 1/00 | (2006.01) |
| H04B 1/40 | (2015.01) |
| H04L 27/00 | (2006.01) |

(52) U.S. Cl.
CPC .............. H04L 7/033 (2013.01); G01S 13/84 (2013.01); H03J 1/005 (2013.01); H04B 1/40 (2013.01); H04L 27/00 (2013.01)

(58) Field of Classification Search
CPC ............ G01S 13/84; H03L 7/16; H04B 17/30
USPC ........................................................ 375/376
See application file for complete search history.

(56) References Cited

U.S. PATENT DOCUMENTS

| | | | |
|---|---|---|---|
| 2,529,510 A | 11/1950 | Manley | |
| 3,713,149 A | 1/1973 | Bruner et al. | |
| 3,725,920 A | 4/1973 | Kupfer et al. | |
| 4,804,961 A | 2/1989 | Hane | |
| 5,220,332 A | 6/1993 | Beckner et al. | |
| 6,359,870 B1 * | 3/2002 | Inoue ................... | H04B 1/1615 370/337 |
| 6,731,908 B2 | 5/2004 | Berliner et al. | |
| 8,274,426 B2 | 9/2012 | Lee | |
| 8,405,543 B2 | 3/2013 | Kluge et al. | |
| 9,274,218 B2 | 3/2016 | Kluge et al. | |
| 2005/0190098 A1 | 9/2005 | Bridgelall et al. | |
| 2013/0288611 A1 | 10/2013 | Kluge et al. | |
| 2016/0178744 A1 | 6/2016 | Kluge et al. | |

FOREIGN PATENT DOCUMENTS

| | | |
|---|---|---|
| DE | 10 2004 042 231 | 3/2006 |
| WO | WO 2002/01247 | 1/2002 |

OTHER PUBLICATIONS

Notice of Allowance issued in the U.S. Appl. No. 13/849,166 dated Sep. 23, 2015, 9 pages.

(Continued)

Primary Examiner — David S Huang
(74) Attorney, Agent, or Firm — Fish & Richardson P.C.

(57) ABSTRACT

In an embodiment, a circuit includes a synchronizer configured to generate a trigger signal synchronized to a reference clock. A synthesizer is configured to synthesize a signal according to frequency control data in response to the trigger signal. A radio receiver is configured to process a carrier signal according to the synthesized signal. A phase measurement unit is configured to measure a first channel frequency response based on the processed carrier signal.

20 Claims, 6 Drawing Sheets

(56) References Cited

OTHER PUBLICATIONS

Office Action and English translation for German Patent Application 10 2009 060 592 dated Sep. 19, 2011.
Office Action and English translation for Chinese Patent Application 200910263720.6 dated Apr. 23, 2012.
Non Final Rejection issued in the U.S. Appl. No. 12/649,205 dated Jun. 8, 2012, 6 pages.
Notice of Allowance issued in the U.S. Appl. No. 12/649,205 dated Nov. 28, 2012, 8 pages.
Non Final Rejection issued in the U.S. Appl. No. 13/849,166 dated Apr. 7, 2015, 8 pages.
Non Final Rejection issued in the U.S. Appl. No. 15/057,076 dated May 23, 2016, 8 pages.
Final Office Action in U.S. Appl. No. 15/057,076 dated Jan. 19, 2017, 12 pages.

\* cited by examiner

FREQUENCY CONTROL DATA SYNCHRONIZATION

TECHNICAL FIELD

This disclosure relates to frequency control data synchronization.

BACKGROUND

A radio network may include multiple radio frequency (RF) nodes. In certain circumstances, determining a distance between two nodes, or performing various other measurements, may be useful in various applications. The distance between two nodes in a radio network can be determined from phase measurements made at the nodes. The phase measurements can be made by both nodes to obtain a radio frequency (RF) phase differential distance measurement. For example, each node transmits an unmodulated carrier signal with a first frequency, followed by an unmodulated carrier signal with a second frequency, where the frequencies differ. Each node measures the phase of each received carrier signal. The distance between the nodes is determined from the stored phases and the speed of light.

SUMMARY

In an embodiment, a circuit includes a synchronizer configured to generate a trigger signal synchronized to a reference clock. A synthesizer is configured to synthesize a signal according to frequency control data in response to the trigger signal. A mixer is configured to process a carrier signal according to the synthesized signal. A phase measurement unit is configured to measure a first channel frequency response based on the processed carrier signal.

In an embodiment, a method comprises: generating, by a synchronizer, a trigger signal synchronized to a reference clock; synthesizing, by a synthesizer, a signal according to frequency control data in response to the trigger signal; processing, by a radio receiver, a carrier signal according to the synthesized signal; and measuring, by a phase measurement unit, a first channel frequency response based on the processed carrier signal.

In an embodiment, a system includes a microcontroller. An interface is configured to receive a channel center frequency change command from the microcontroller. A synchronizer is coupled to a reference clock and configured to generate a trigger signal synchronized to the reference clock. A phase-locked loop (PLL) synthesizer is coupled to the reference clock and configured to synthesize a signal with a channel center frequency specified by the channel center frequency change command in response to the trigger signal. A radio receiver is coupled to the PLL synthesizer and configured to process a carrier signal according to the synthesized signal. A phase measurement unit coupled to the reference clock and the synchronizer and configured to measure a first channel frequency response based on the processed carrier signal.

DETAILED DESCRIPTION

Example System

In one example scenario, RF phase differential distance measurements involve relatively low computational effort and deliver relatively good results in open or outdoor environments. For indoor or dense urban environments, however, the propagation of radio waves is severely impacted by multipath characteristics of the channel. Phase offsets between phase-locked loops (PLLs) used by nodes to determine the phase of a received carrier signal can create pseudo multipath interference in a measured channel impulse response used to determine a distance along a straight past (e.g., line-of-sight (LOS) distance). This pseudo multipath interference can result in reduced precision of the distance measurement.

Figure 1:
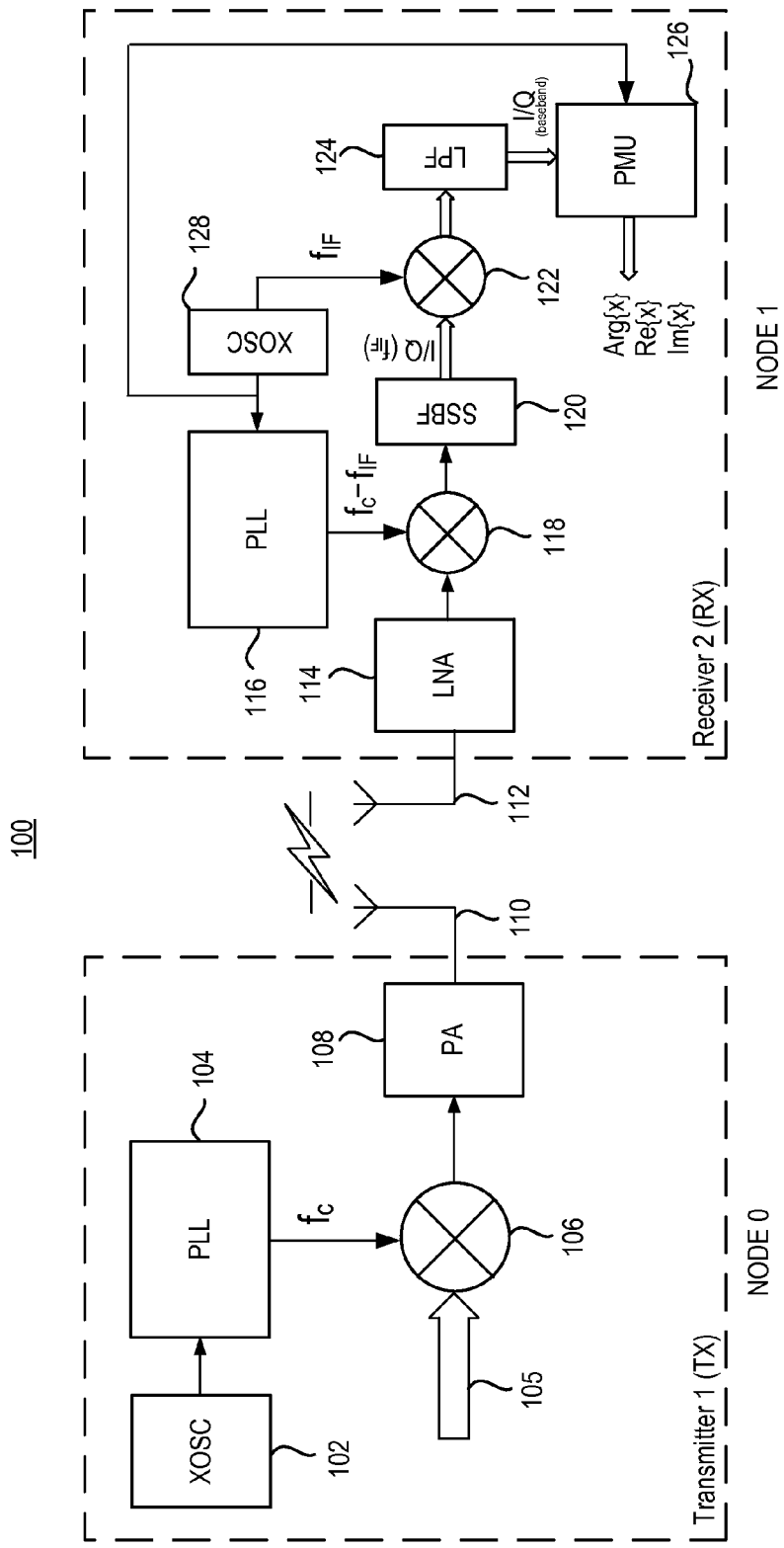
FIG. 1 is a conceptual block diagram of an example radio network in accordance with an embodiment.

FIG. 1 is a conceptual block diagram of an example radio network 100 in accordance with an embodiment. Radio network 100 can include radio transmitter 1 (TX) and radio receiver 2 (RX). The transmitter TX can be included in a first node of radio network 100 ("Node 0") and the receiver RX can be included in a second node of radio network 100 ("Node 1"). The foregoing notwithstanding, one embodiment provides that each node includes both a transmitter and a receiver, which can be integrated in a radio "transceiver." Communications between Nodes 0 and 1 can comply with various predefined communication protocols, such as, for example, IEEE802.15.1 or IEEE802.15.4. However, the present technology is not limited to these example protocols. Indeed, other communication protocols may also be implemented.

In the example shown, radio transmitter TX includes reference clock generator 102 (e.g., a crystal oscillator (XOSC)), PLL 104, mixer 106 and power amplifier (PA) 108. PLL 104 synthesizes a channel center frequency $f_c$ from a reference clock provided by reference clock generator 102, which is used by mixer 106 to shift the channel center frequency $f_c$ of carrier signal 105. Carrier signal 105 is amplified by PA 108 and transmitted by antenna 110. In practice, transmitter TX would include other components but those components have been omitted from FIG. 1 to simplify discussion.

Receiver RX includes low-noise amplifier (LNA) 114, PLL 116, reference clock generator 128, single side band filter (SSBF) 120, mixer 118, digital front end (DFE) 122, low pass filter (LPF) 124 and phase measurement unit (PMU) 126. PLL 116, DFE 122 and PMU 126 are all driven by reference clock generator 128. LNA 114 amplifies the carrier signal (frequency shifted carrier signal 105) received on antenna 112. The received carrier signal is mixed down by mixer 118 to an intermediate frequency (IF) signal, which is routed to SSBF 120 to generate an IF in-phase/quadrature (I/Q) signal. DFE 122 and LPF 124 generate a baseband I/Q signal from the IF I/Q signal, which is fed into PMU 126. PMU 126 measures phase and other parameters of the baseband I/Q signal. The phase and parameters can then be used, for example, in RF phase differential distance measurements, as described below. It is noted, however, that the phase and parameters may also be used for other purposes, and that the present technology is not limited to any particular implementation.

In radio network 100, an embodiment provides that the distance d between Nodes 0 and 1 is to be determined. The distance d can be determined using RF phase differential distance measurements. Using this technology with IF-inversion, Node 1 allows computation of a distance measurement in both directions (Node 0→Node 1, Node 1→Node 0), while preserving the PLL phase relations:

$$0 \to 1: \phi_{01} = -(\omega_c \cdot d/c + (\phi_{PLL0} - \phi_{PLL1})), \quad [1]$$

$$1 \to 0: \phi_{10} = \omega_c \cdot d/c + (\phi_{PLL1} - \phi_{PLL0}), \quad [2]$$

where c is the speed of light, the subscript "01" indicates the phase measurement on Node 1 stimulated by Node 0 and subscript "10" indicates the phase measurement on Node 0 stimulated by Node 1. This allows cancelling out of the RX-TX PLL phase offset:

$$\phi(d) = \phi_{10} - \phi_{01} = 2 \cdot \omega_c \cdot d/c. \quad [3]$$

In an embodiment, the phase measurements are calculated by the PMU at each node (e.g., PMU 126) by configuring, for example, the receiver RX at Node 0 to generate an inverted IF ($-f_{IF}$), configuring the transmitter of Node 1 to generate a center frequency ($f_c - f_{IF}$) and disabling the PLL IF-shift of the center frequency on the TX-RX change. The PMU can measure a conjugate complex signal (sign-inverted phase) from the inverted IF ($-f_{IF}$).

$\phi(d)$ in Equation [3] is the phase related to a single carrier ($\omega_c$) transmission over a single path radio channel of distance d. Here, $\phi(d)$ has an ambiguity over $\lambda/2 = \pi \cdot c/\omega_c$, which is resolved by a delta frequency approach, such as, for example, in a manner described below.

Given the phase measurements for two different center frequencies, the delta frequency approach allows extension of the range of ambiguity:

$$\phi(d, \omega_{c1}) = 2 \cdot \omega_{c1} \cdot d/c, \quad [4]$$

$$\phi(d, \omega_{c2}) = 2 \cdot \omega_{c2} \cdot d/c, \quad [5]$$

$$\phi(d, \Delta f) = \phi(d, \omega_{c2}) - \phi(d, \omega_{c1}) \quad [6]$$
$$= 2 \cdot (\omega_{c2} - \omega_{c1}) \cdot d/c$$
$$= 2 \cdot 2\pi \cdot \Delta f \cdot d/c.$$

$\phi(d, \Delta f)$ is the phase related to an equivalent single carrier ($2\pi \cdot \Delta f$) transmission over a single path radio channel $\omega_c$ or distance d. Here, $\phi(d, \Delta f)$ has an ambiguity over $\lambda/2 = c/(2 \cdot \Delta f)$.

Using the delta frequency approach, a complex frequency discrete "ranging" channel frequency response can be expressed as, $$H_{01}(f_c) = (H_{ch}(f_c) \cdot e^{i \cdot \Delta \phi_{01}(f_c)})^*, \quad [7]$$

$$H_{10}(f_c) = H_{ch}(f_c) \cdot e^{i \cdot \Delta \phi_{10}(f_c)}, \quad [8]$$

$$H_{rng}(f_c) = H_{01}(f_c)^* \cdot H_{10}(f_c) \quad [9]$$
$$= H_{ch}(f_c) \cdot H_{ch}(f_c),$$

where $H_{ch}$ is the channel frequency response, $f_c$ is the channel center frequency, $\Delta f$ is a frequency step change and $\Delta \phi_{pll01}$, $\Delta \phi_{pll10}$ are random phase offsets. Note that the conjugation in [7] is due to IF-inversion in receiver Node 1.

Stepping over k=1 . . . N adjacent frequencies in the frequency band allows a complex frequency discrete "ranging" channel response to be constructed:

$$H_{rng}(f_c + k \cdot \Delta f) = H_{ch}(f_c + k \cdot \Delta f)^2. \quad [10]$$

Figure 2:
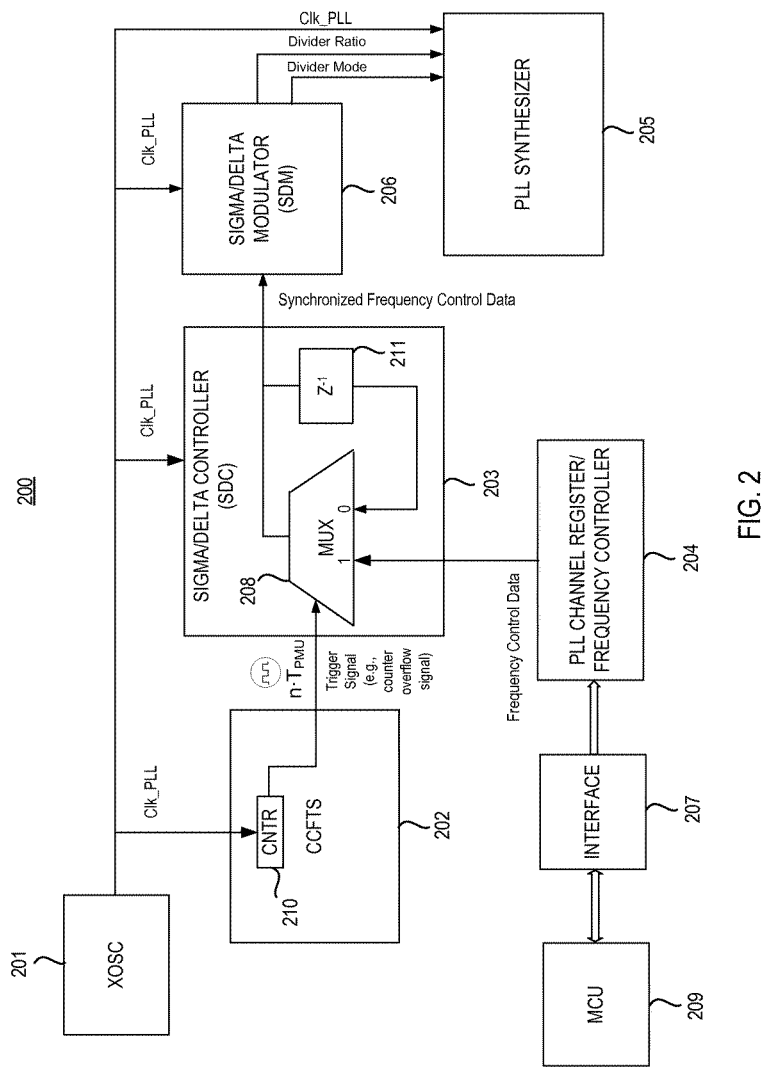
FIG. 2 is a conceptual block diagram of an example channel center frequency time synchronization (CCFTS) system in accordance with an embodiment.

Note that each PLL settling on a new center frequency causes a new set of $\Delta \phi_{01}$ and $\Delta \phi_{10}$, which can be resolved by CCFTS, such as, for example, as described herein with reference to FIG. 2.

A channel impulse response $H_{rng}(t)$ is calculated from $H_{rng}(f_c + k \cdot \Delta f)$ by an inverse fast Fourier transformation (IFFT):

$$h_{rng}(n \cdot \Delta t) = F^{-1}\{H_{ch}(f_c + k \cdot \Delta f)\} * F^{-1}\{H_{ch}(f_c + k \cdot \Delta f)\}, \quad [11]$$

with a time resolution of $\Delta t = (k_{max} \cdot \Delta f)$. Or related to the channel distance by substituting $\Delta t = \Delta d/c$:

$$h_{rng}(n \cdot \Delta d/c) = F^{-1}\{H_{ch}(f_c + k \cdot \Delta f)\} * F^{-1}\{H_{ch}(f_c + k \cdot \Delta f)\}, \quad [12]$$

In some implementations, the inverse transform F is an IFFT with two times (2×) oversampling and a modified filter for windowing (e.g., by implementing Hanning, Hamming, or Blackmann windows). The first impulse (e.g., from the component with the shortest LOS distance) can be found using a peak search algorithm on the ranging impulse response $h_{rng}(t)$. The transit time $t_{peak}$ corresponding to the first impulse of $h_{rng}(t)$ multiplied by the speed of light gives the distance d.

The foregoing withstanding, auto-convolution of the channel impulse response can cause a pseudo peak in the impulse response $h_{rng}(t)$. This pseudo peak could be mistakenly detected by the peak search algorithm as the first impulse, thus resulting in a reduced precision of the distance measurement d. To improve the precision, an embodiment provides that a CCFTS system is implemented, such as, for example, as described in reference to FIG. 2.

RF Phase Differential Distance Measurements

In an embodiment, sequence, $k \in [0 \ldots N_f]$ of phase measurements are made at Nodes 0 and 1 for a RF phase differential distance calculation. As previously defined in Equations [7] and [8], the frequency responses of the carrier signal measurements at Node 0 and Node 1 are given, respectively, by $$H_{01}(f_c) = (H_{ch}(f_c) \cdot e^{i \cdot \Delta \phi_{01}(f_c)})^*, \quad [13]$$

$$H_{10}(f_c) = H_{ch}(f_c) \cdot e^{i \cdot \Delta \phi_{10}(f_c)}. \quad [14]$$

The random PLL phase offset drift $\delta \phi_{pll01}$ (for a measurement at Node 1) is given by, $$\delta \phi_{pll01} = 2\pi \cdot \Delta f \cdot (\Delta t_{01} + T_f), \quad [15]$$

where $T_f$ is the stepping period (the duration between two phase measurements at Node 1) and $\Delta t_{01}$ is a time offset between stepping protocol of both nodes, as described in further detail below.

The term $\delta \phi_{pll01}$ can be estimated from the measured frequency response:

$$P(k) = H_{01}(k) \cdot H_{10}(k) = |H_{ch}(k)|^2 \cdot e^{i(k \cdot 2\delta \phi_{pll01})}. \quad [16]$$

With $P(f) = P(f_c + k\Delta f)$, $$P2(f) = P(k) \cdot P(k-1)^* = |H_{ch}(k)|^2 |H_{ch}(k-1)|^2 \cdot e^{(2i\delta \phi_{pll01})}, \quad [17]$$

$$\delta \phi_{pll01} \approx \arg(\Sigma_k P2(k)). \quad [18]$$

From the PLL phase offset drift $\delta \phi_{pll01}$, the phase offset over frequency is given by, $$\Delta \phi_{pll01}(f_c + k \Delta f) = \arg(P(f_c)) + k \cdot \delta \phi_{pll01}, \quad [19]$$

which (optionally) can directly be used to combine measurements $H_{01}(k)$, $H_{10}(k)$ to generate the ranging channel frequency response $H_{rng}(k)$ to improve the signal-to-noise ratio (SNR) (e.g., by 3 dB):

$$H_{rng}(k)=H_{01}(k)+H_{10}(k)\cdot\exp(i\cdot\Delta\phi_{pll01}(k)),\text{ or} \quad [20a]$$

$$H_{rng}(k)\approx H_{01}(k) \quad [20b]$$

and the ranging channel impulse response is given by, $$h_{rng}(t)=F^{-1}\{H_{01}(f)\},\text{ or} \quad [21a]$$

$$h_{rng}(t)=F^{-1}\{H_{rng}(f)\}\text{ (to improve the SNR),} \quad [21b]$$

where $F^{-1}$ is an IFFT with a window function (e.g., Hanning window).

The corresponding distance offset $s_{pll01}$ to shift the ranging impulse response is given by:

$$s_{pll01} = \frac{\delta\phi_{pll01}}{2\pi} \cdot \frac{c}{\Delta f}. \quad [22]$$

Assuming that the ranging channel impulse response in Equations [21a] or [21b] has a first peak with a transit time $t_{peak}$, the corrected distance d then is:

$$d = \text{mod}\left(c \cdot t_{peak} + \frac{s_{pll01}}{2}, \frac{c}{2\Delta f}\right), \quad [23]$$

where $t_{peak}$ is determined by peak searching the ranging impulse response $h_{rng}(t)$. Shifting the ranging channel impulse response by the distance offset $s_{pll01}$ compensates for the constant phase drift caused by $\Delta t_{01}$ (the PLL time offsets) and $T_f$ the stepping period.

The unknown time offset $\Delta t_{01}$ in Equation [15] is caused by a timing jitter caused by (1) certain microcontrollers when they provide commands to an external interface (e.g., serial protocol interface (SPI)), (2) and timing inaccuracies due to the external interface itself. That is $\Delta t_{01}$ is not constant and will vary between channel center frequency step changes $\Delta f$. However, an embodiment provides that the unknown time offset $\Delta t_{01}$ is kept constant while stepping through the channel center frequencies using CCFTS, as described in reference to FIG. 2.

Example Application of CCFTS

FIG. 2 is a conceptual block diagram of an example CCFTS system 200 in accordance with an embodiment. System 200 can include reference clock generator 201, CCFTS module 202, sigma/delta controller (SDC) 203, PLL channel register/frequency controller 204, PLL synthesizer 205, sigma/delta modulator (SDM) 206 and interface 207 (e.g., an SPI interface or asynchronous interface). SDC 203 further comprises multiplexer 208 and element 211 ($Z^{-1}$) is a unit delay operator.

CCFTS 202, SDC 203, SDM 206 and PLL synthesizer 205 are all driven by reference clock Clk_PLL. A channel center frequency change command (e.g., a frequency control word) is received by interface 207 and loaded into a PLL channel register of frequency controller 204. The channel center frequency change command causes PLL synthesizer 205 to change the center frequency of the synthesized frequency signal (a frequency step change). CCFTS 202 includes a fixed range synchronizer counter 210 (CNTR) (e.g., a synchronous binary counter) that triggers an output on counter overflow. The output is a trigger signal that is synchronized to reference clock Clk_PLL. In some implementations, the channel center frequency change command is provided by a microcontroller unit (MCU) 209.

The trigger signal is used to select among two inputs of multiplexer 208 in SDC 203. When the trigger signal is high (e.g., logic "1"), frequency control data (e.g., a frequency control word) stored in PLL channel register/frequency controller 204 is routed to SDM 206. SDM 206 receives the synchronized frequency control data and generates PLL control information (e.g., divider ratio, divider mode) based on the synchronized frequency control data, and the PLL control information. The PLL control information is sent to PLL synthesizer 205, which uses the control information to synthesize a signal with a center frequency specified by the frequency control data.

In one embodiment, PLL synthesizer 205 is a fractional-N PLL. For fractional-N PLLs the instant phase of the PLL is bound to reference clock Clk_PLL provided by reference clock generator 201, which is typically of a lower frequency (e.g., 26 MHz). Additionally, when changing the PLL center frequency the phase of the reference clock Clk_PLL continues instantly according to the new frequency value. In general, CCFTS module 202 is a synchronizer that transforms channel center frequency change commands from interface 207 (with timing jitter) to a strict constant timing synchronized to the reference clock Clk_PLL.

In one embodiment, the synchronizer is based on fixed range synchronizer up counter 210 in CCFTS module 202 that increments a count on each pulse of reference clock Clk_PLL, and whose counter overflow immediately applies a new frequency control data to PLL synthesizer 205 via SDC 203 and SDM 206. The new frequency control data is the cached information of the last channel center frequency change command from interface 207.

In some implementations, the raster for channel frequency changes can be determined to be equal to a multiple n of a phase measurement period $T_{PMU}$ or $n \cdot T_{PMU}$. Although the counters for phase measurement (e.g., running at a system clock of 32 MHz) and for CCFTS (e.g., running at a reference clock of 26 MHz) meet at a common period of $T_{PMU}$ (e.g., 8 μs), this is not a requirement for CCFTS. However, an embodiment provides that for each counter (or synthesizer) with regard to distance measurements constant periods are delivered while stepping through (shifting) the channel center frequencies. If CCFTS system 200 is implemented in Nodes 0 and 1 and Nodes 0 and 1 run with the same stepping period $T_f$, the time offset ($\Delta t_{01}$) between the nodes depends only on the initial protocol synchronization and is constant over the sequence of channel center frequency steps $\Delta f$. If $\Delta t_{01}$ is constant over the sequence of channel center frequency steps the PLL phase offset drift $\delta\phi_{pll01}$ will also be constant over the sequence.

Example Process

Figure 3:
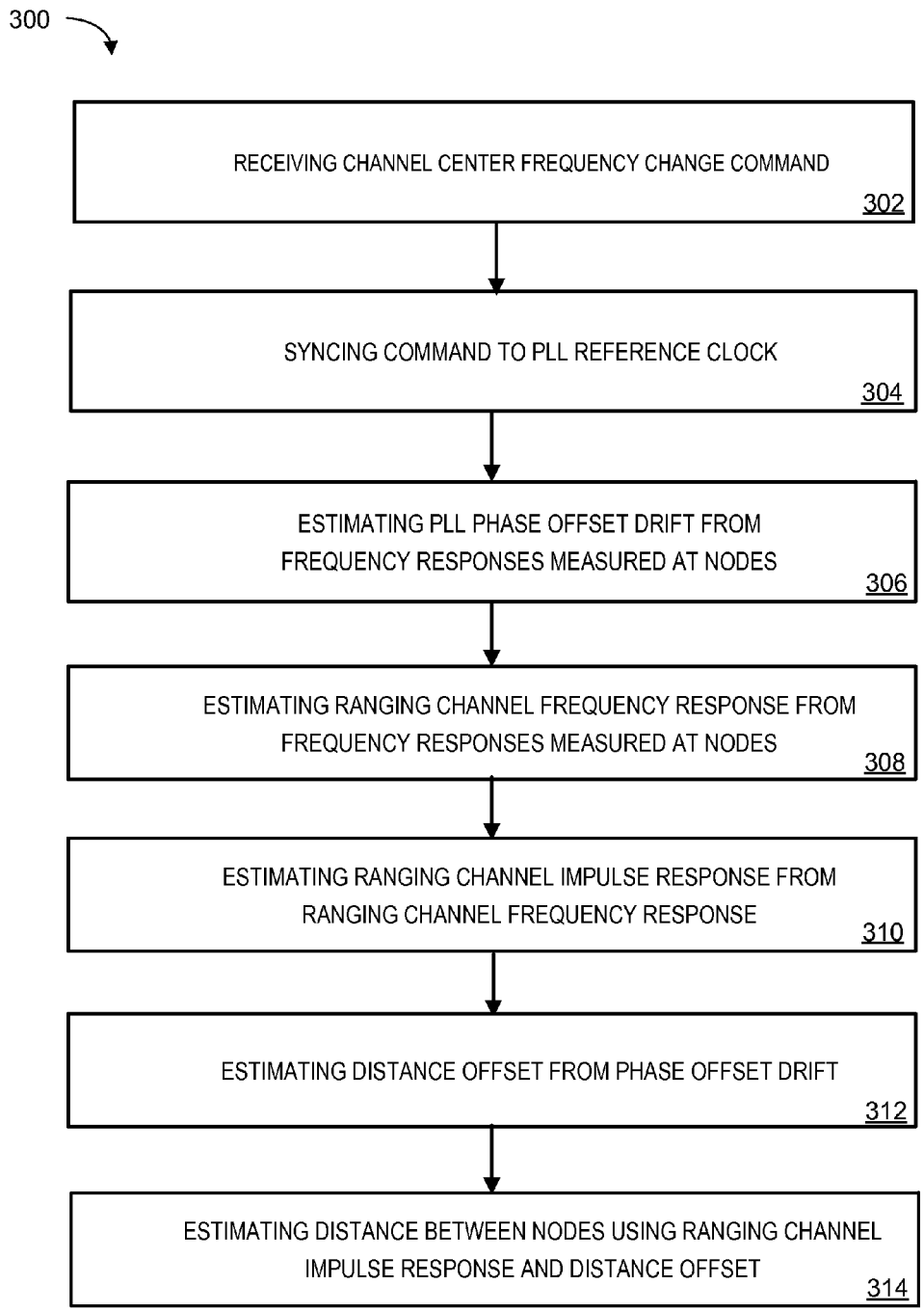
FIG. 3 is a flow diagram of an example process for making RF phase differential distance measurements with CCFTS in accordance with an embodiment.

FIG. 3 is a flow diagram of an example process 300 for making RF phase differential distance measurements with CCFTS. Process 300 can be implemented by, for example, systems 100, 200 described in reference to FIGS. 1 and 2, respectively.

In some implementations, process 300 can begin by receiving a channel center frequency change command (302). For example, an interface of a transceiver chip in a node can receive a channel center frequency change command (e.g., a frequency control word) from a microcontroller and store the command in, for example, a PLL channel register of a frequency controller.

Process 300 can continue by syncing the channel center frequency change command to a PLL reference clock (304) coupled to a PLL synthesizer used to implement the channel center frequency change according to the frequency control word. For example, the channel center frequency change command can be transferred to a sigma/delta controller for controlling a PLL synthesizer on a constant period.

Process 300 can continue by estimating a PLL phase offset drift from frequency responses measured at the nodes (306), as described in Equations [11]-[15].

Process 300 can continue by estimating a ranging channel frequency response from frequency responses measured at the nodes (308). For example, complex transfer functions can be measured at each node based on the received carrier signals, and the amplitude and phase of those transfer functions can be used to estimate the ranging channel frequency response, according to Equation [20a] or [20b].

Process 300 can continue by estimating a ranging channel impulse response from the ranging channel frequency responses measured at the nodes (310). For example, an IFFT can be used to generate the ranging channel impulse response from the ranging channel frequency response, according to Equations [21a] or [21b].

Process 300 can continue by estimating a distance offset from the random PLL phase offset drift (312), according to Equation [22].

Process 300 can continue by shifting an impulse response of the ranging channel frequency response using the estimated distance offset (314), according to Equation [23]. The impulse response of the ranging channel frequency response can be generated from, for example, an IFFT of the ranging channel frequency response. Shifting the ranging channel impulse response compensates for the constant phase drift caused by $\Delta t_{01}$ (the PLL time offsets) and $T_f$ the stepping period. Shifting the impulse response changes its position but not its shape. CCFTS allows detection of the correct impulse response by directly evaluating $H_{01}$ or $H_{10}$ or a superposition of the two.

Figure 4A:
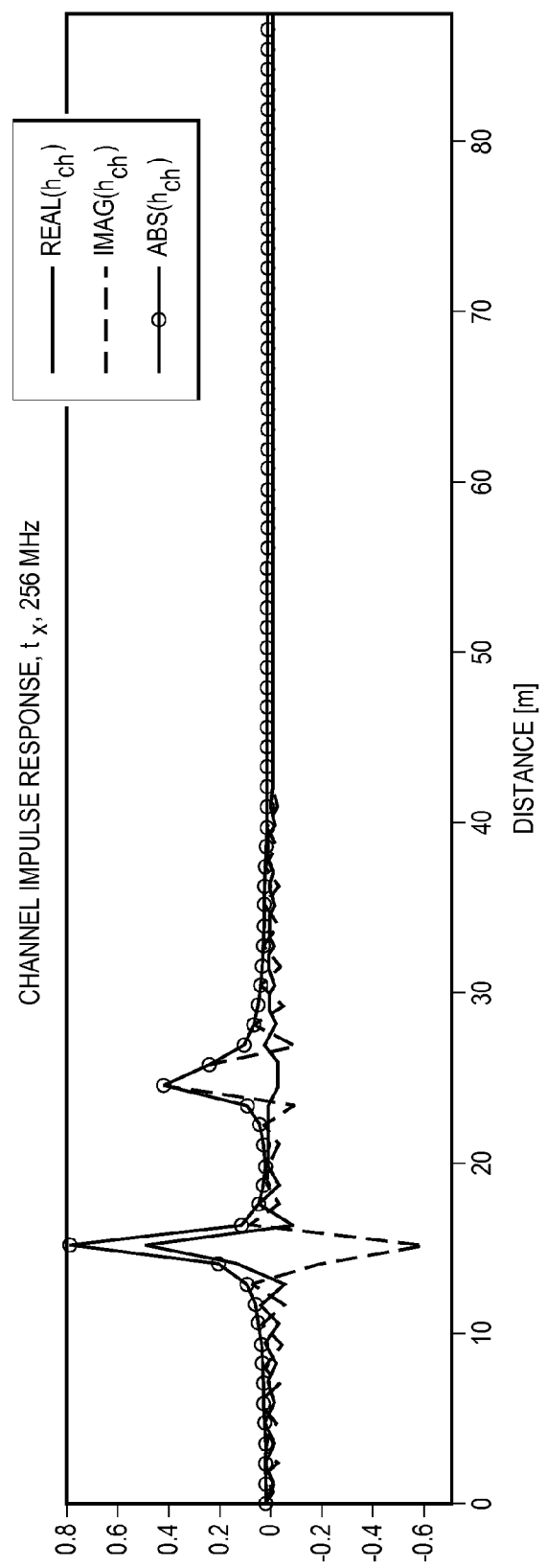
FIGS. 4A-4C are graphs of an example ranging channel impulse response with and without CCFTS in accordance with an embodiment.
Figure 4B:
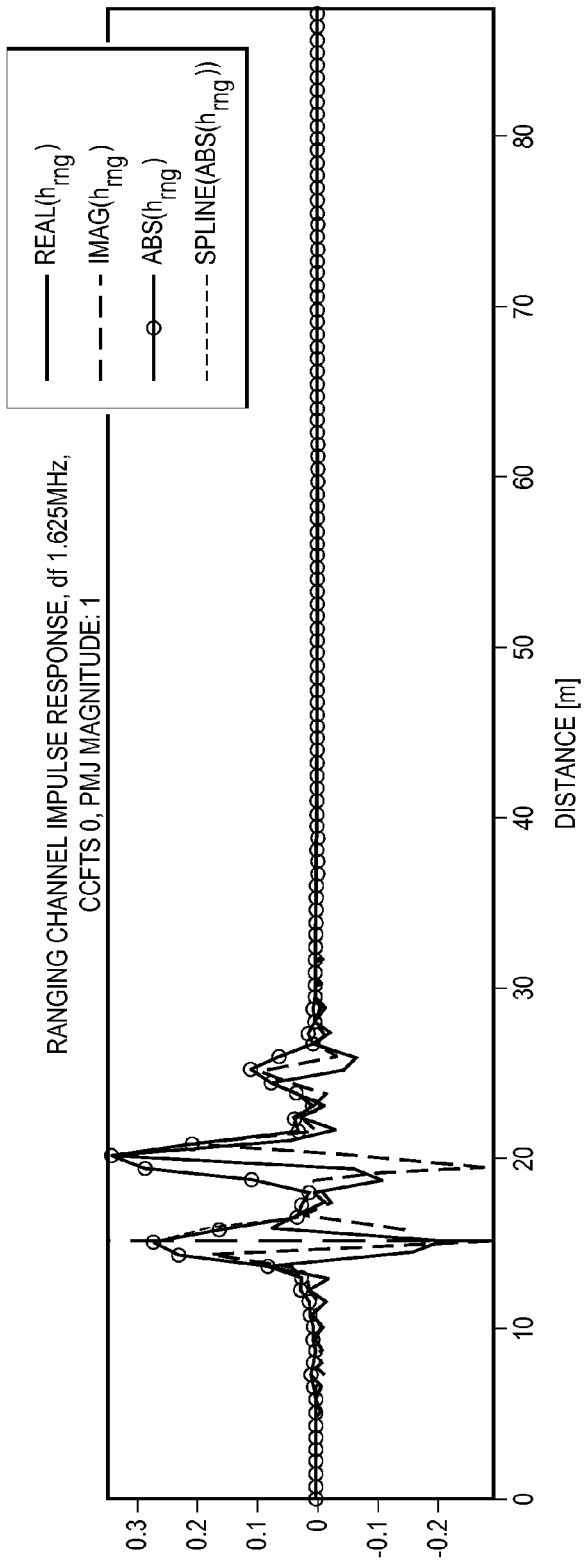
Figure 4C:
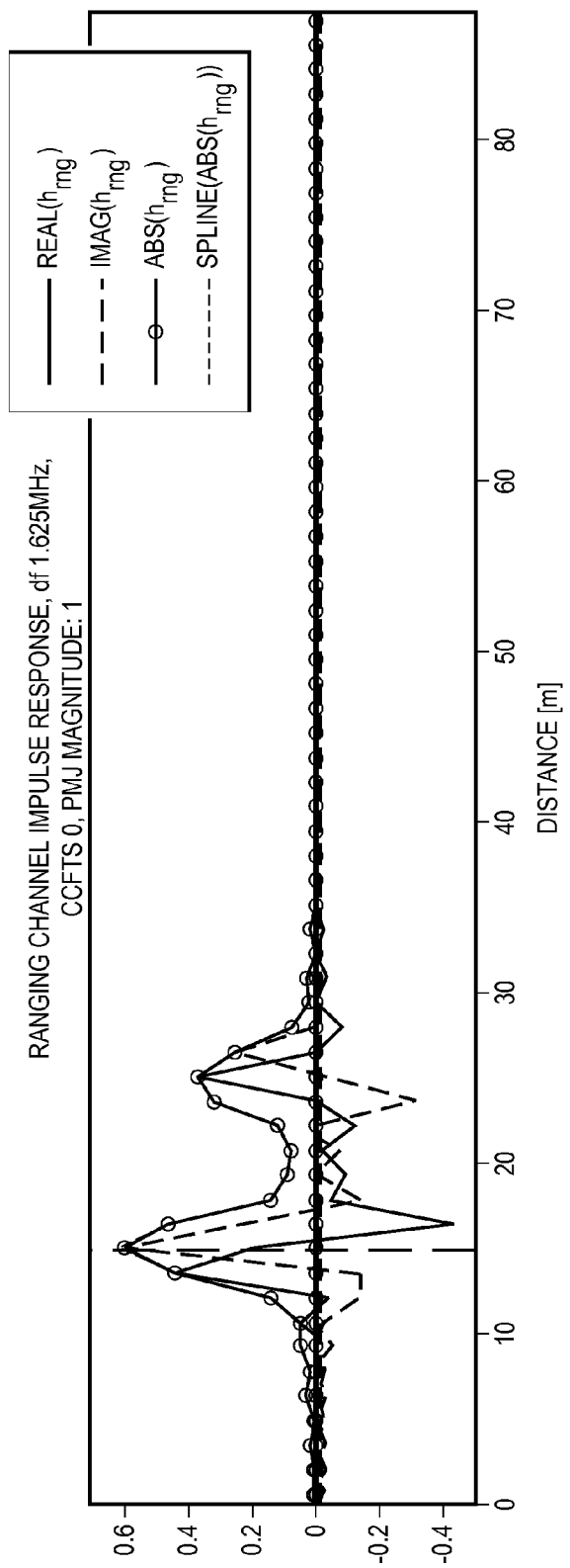

FIGS. 4A-4C are graphs of the ranging channel impulse response with and without CCFTS. All computations are done in the I/Q signal space. FIG. 4A illustrates a 2-tap reference ranging channel impulse response with resolution of 256 MHz. Visible side lobes are caused by interpolation with sin(x)/x according to the sampling theorem. FIG. 4B shows the measured ranging channel impulse response. As CCFTS is disabled adjacent channel frequency steps have a random PLL phase relation without consideration of the stepping period $T_f$. To mitigate the random PLL phase between adjacent channel frequency steps the single-side measurements of the complex channel frequency response at Node 1 as $H_{01}(f)$ and Node 0 as $H_{10}(f)$ are combined:

$$H_{rng}(f) = \text{conj}(H_{01}(f)) * H_{10}(f). \quad [24]$$

This removes the random PLL phase and the PLL phase offset between Node 0 and Node 1 because transmission in both directions share a sign-inverted term for the PLL phase. However, as an unwanted consequence the corresponding ranging channel impulse response $h_{rng}(t)$ becomes a convolution of $h_{01}(t)$ and $h_{10}(t)$ respectively, which can be interpreted as a serial concatenation of two channel transfers:

$$h_{rng}(t) = F^{-1}\{H_{rng}(f)\}. \quad [25]$$

The convolution of a 2-tap ranging channel impulse response with itself returns a 3-tap impulse response with a strong pseudo tap in the middle, which can be seen at $h_{rng}(d)$ in FIG. 4B. The strength of the center pseudo tap depends on the phase and magnitude relation of tap 1 and tap 2.

FIG. 4C shows the 2-tap ranging channel impulse response with CCFTS applied. The resulting ranging channel impulse response with the strong pseudo tap in the middle removed.

While this document contains many specific implementation details, these should not be construed as limitations on the scope of what may be claimed but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A circuit comprising:
   a synchronizer configured to generate a trigger signal synchronized to a reference clock;
   a synthesizer configured to synthesize a signal according to frequency control data in response to the trigger signal;
   a radio receiver configured to process a carrier signal according to the synthesized signal and
   to measure a first channel frequency response based on the processed carrier signal.

2. The circuit of claim 1, further comprising:
   a controller coupled to the synthesizer and configured to receive the frequency control data from a register and route a command to the synthesizer in response to the trigger signal.

3. The circuit of claim 2, where the controller further comprises:
   a multiplexer having a first input coupled to the register and a second input coupled to an output of the multiplexer, wherein in response to the trigger signal the frequency control data is routed to the controller.

4. The circuit of claim 3, wherein the circuit further comprises:
   a sigma/delta modulator coupled to the output of the multiplexer and configured to command the synthesizer based on the frequency control data.

5. The circuit of claim 2, where the trigger signal is a periodic signal that has a constant period over channel center frequency changes.

6. The circuit of claim 5, where the period is equal to a multiple of a phase measurement period used to measure the first channel frequency response.

7. The circuit of claim 1, where the circuit is included in a first node of a radio network and further comprises:
   a processor configured to:
   estimate a phase offset and phase offset drift based on the first channel frequency response and a second channel frequency response measured by a second node of the radio network;
   estimating a ranging channel frequency response based on the first channel frequency response;
   estimating a distance offset based on the phase offset drift; and estimating a distance between the first and second nodes based on the ranging channel frequency response and the distance offset.

8. The circuit of claim 7, wherein estimating the distance between the first and second nodes based on the ranging channel frequency response and the distance offset, further comprises:
   transforming the ranging channel frequency response into a ranging impulse response;
   estimating the distance based on the ranging impulse response; and
   correcting the distance based on the distance offset.

9. A method comprising:
   generating, by a synchronizer, a trigger signal synchronized to a reference clock;
   synthesizing, by a synthesizer, a signal according to frequency control data in response to the trigger signal;
   processing, by a radio receiver, a carrier signal according to the synthesized signal; and
   measuring, by the radio receiver, a first channel frequency response based on the processed carrier signal.

10. The method of claim 9, further comprising:
    receiving, by a controller, the frequency control data from a register; and
    routing, by the controller, a command to the synthesizer in response to the trigger signal.

11. The method of claim 10, where the trigger signal is generated in response to an overflow of a counter in the synchronizer, and where the counter is incremented based on the reference clock.

12. The method of claim 10, wherein the trigger signal is a periodic signal that has a constant period.

13. The method of claim 12, wherein the constant period is equal to a multiple of a phase measurement period used to measure the first channel frequency response.

14. The method of claim 9, further comprising:
    controlling, by a sigma/delta modulator, the synthesizer according to the frequency control data.

15. The method of claim 9, where the method is performed by a first node of a radio network and further comprises:
    estimating, by a processor, a phase offset and phase offset drift based on the first channel frequency response and a second channel frequency response measured by a second node of the radio network;
    estimating, by the processor, a ranging channel frequency response based on the first channel frequency response;
    estimating, by the processor, a distance offset based on the phase offset drift; and
    estimating, by the processor, a distance between the first and second nodes using the ranging channel frequency response and the distance offset.

16. The method of claim 15, wherein estimating the distance between the first and second nodes using the ranging channel frequency response and the distance offset, further comprises:
    transforming, by the processor, the ranging channel frequency response into a ranging impulse response;
    estimating, by the processor, the distance based on the ranging impulse response; and
    correcting, by the processor, the distance based on the distance offset.

17. A system comprising:
    a microcontroller;
    an interface configured to receive a channel center frequency change command from the microcontroller;
    a synchronizer coupled to a reference clock, the synchronizer configured to generate a trigger signal synchronized to the reference clock; and
    a phase-locked loop (PLL) synthesizer coupled to the reference clock, the PLL synthesizer configured to synthesize a signal with a channel center frequency specified by the channel center frequency change command in response to the trigger signal;
    a radio receiver coupled to the PLL synthesizer and configured to process a carrier signal according to the synthesized signal and
    to measure a first channel frequency response based on the processed carrier signal.

18. The system of claim 17, further comprising:
    a controller coupled to the PLL synthesizer and configured to receive the channel center frequency change command from a register and route the command to the PLL synthesizer in response to the trigger signal generated by the synchronizer, where the trigger signal is a periodic signal having a constant period.

19. The system of claim 18, where the channel center frequency change command includes frequency control data and the controller further comprises:
    a multiplexer having a first input coupled to the register and a second input coupled to an output of the multiplexer, wherein in response to the trigger signal the frequency control data is routed to the controller.

20. The system of claim 19, wherein the radio transceiver further comprises:
    a sigma/delta modulator coupled to the output of the multiplexer and configured to command the PLL synthesizer based on the frequency control data.

* * * * *